United States Patent [19]

Takimoto et al.

[11] Patent Number: 4,622,988

[45] Date of Patent: Nov. 18, 1986

[54] LIQUID REPLENISHING APPARATUS

[75] Inventors: Hiroaki Takimoto; Tetsuo Miyajiri; Tamio Turita; Masanori Fujikawa, all of Yokohama, Japan

[73] Assignee: Sumitomo Electric Industries, Ltd., Osaka, Japan

[21] Appl. No.: 735,733

[22] Filed: May 20, 1985

[30] Foreign Application Priority Data

May 21, 1984 [JP] Japan .................... 59-100431

[51] Int. Cl.[4] .............................. B01D 5/01
[52] U.S. Cl. ...................... 137/209; 137/572
[58] Field of Search ............ 137/209, 240, 206, 572, 137/599

[56] References Cited

U.S. PATENT DOCUMENTS 3,698,870 10/1972 De Jong ............... 137/209 X

Primary Examiner—Alan Cohan
Attorney, Agent, or Firm—Cushman, Darby & Cushman

[57] ABSTRACT

A liquid replenishing apparatus for supplying liquid raw material replenishment for liquid raw material of an article to at least one raw material tank, including a replenishment tank for storing the liquid raw material replenishment, a first pipe extending between the replenishment tank and the raw material tank, a second pipe for introducing pressurized gas into a space of the replenishment tank, a branch pipe communicating with the first and second pipes, a pressure regulator provided in the second pipe, and a flow regulator provided in the branch pipe.

4 Claims, 6 Drawing Figures

LIQUID REPLENISHING APPARATUS

BACKGROUND OF THE INVENTION

The present invention generally relates to a production machine for producing semiconductors, optical fiber or the like and more particularly, to a liquid replenishing apparatus for performing replenishment of liquid raw material of the semiconductors, optical fiber or the like into a raw material tank of a gas supplying apparatus arranged to supply gaseous raw material of the semiconductors, optical fiber or the like to a reaction vessel in the production machine.

Generally, optical fiber is produced by a vapor phase axial deposition (VAD) method, an outside chemical vapor deposition (outside CVD) method, an inside CVD method, etc. In the VAD method, gaseous raw material of optical fiber obtained by vaporizing liquid raw material of optical fiber in a raw material tank is burnt into glass soot and then, the glass soot is deposited on a rotating starting member so as to be formed into rodlike porous base material of glass (preform rod) such that the porous base material is subjected to spinning into optical fiber by a melting furnace. Thus, in the VAD method, it becomes necessary to provide a liquid replenishing apparatus for sequentially replenishing the raw material tank with the liquid raw material. One example of such a prior art liquid replenishing apparatus is shown in FIGS. 1 and 2. As shown in FIG. 1, liquid raw material 2 of optical fiber is stored in an airtight raw material tank 1 in which a space 3 is defined above a liquid level of the liquid raw material 2. A pipe 5 is led from the space 3 to a reaction burner (not shown) for producing a base material of glass for optical fiber by a vapor phase reaction. Thus, the liquid raw material 2 in the raw material tank 1 gradually decreases in amount upon supply of gaseous raw material of the optical fiber, i.e., saturated vapor of the liquid raw material 2 from the raw material tank 1 to the reaction burner. Accordingly, the raw material tank 1 is required to be sequentially replenished with the liquid raw material 2 as necessary by the liquid replenishing apparatus. To this end, a pipe 6 is extended, through an on-off valve 11, between a replenishment tank 7 for storing therein liquid raw material replenishment 8 for the liquid raw material 2 and the raw material tank 1. A sufficient amount of the liquid raw material replenishment 8 necessary for the raw material tank 1 is stored in the replenishment tank 7.

Meanwhile, in the replenishment tank 7, a space 9 is defined above a liquid level of the liquid raw material replenishment 8. A pipe 10 for introducing pressurized gas into the space 9 is provided so as to extend between the space 9 and a source (not shown) of the pressurized gas via an on-off valve 12 and a flow regulator 15. The pipe 10 is communicated, at a portion thereof between the flow regulator 15 and the on-off valve 12, with the pipe 6 by way of a branch pipe 6'. An on-off valve 13 is provided in the course of the branch pipe 6'. In the raw material tank 1 and the replenishment tank 7, pipes 4 and 24 are, respectively, extended, through on-off valves 16 and 36, from the spaces 3 and 9 to a gas treating apparatus for treating exhaust gas generated in the spaces 3 and 9.

Supply of the liquid raw material replenishment 8 in the known liquid replenishing apparatus shown in FIGS. 1 and 2 is performed as follows. Initially, as shown in FIG. 1, the on-off valves 13 and 36 are closed, while the on-off valves 11 and 12 are opened. Thus, since the pressurized gas, usually pressurized nitrogen gas, is introduced into the space 9 via the pipe 10, a pressure in the space 9 is raised higher than a pressure in the space 3, so that a portion of the liquid raw material replenishment 8 is supplied from the replenishment tank 7 to the raw material tank 1 via the pipe 6. A flow rate of the liquid raw material replenishment 8 delivered from the replenishment tank 7 to the raw material tank 1 is adjusted to a predetermined value by the flow regulator 15. At the time when the liquid raw material replenishment 8 has been supplied to the raw material tank 1 such that the liquid raw material 2 reaches a predetermined liquid level in the raw material tank 1, the on-off valves 11 and 12 are closed so as to stop supply of the liquid raw material replenishment 8 from the replenishment tank 7 to the raw material tank 1. At this time, the pipe 6 is filled with the liquid raw material replenishment 8. The liquid raw material replenishment 8 remaining in the pipe 6 undesirable may corrode the pipe 6 and therefore, should be discharged from the pipe 6. FIG. 2 shows a state of the known liquid replenishing apparatus in which changeover of the on-off valves 11, 12, 13 and 36 is performed from the state of FIG. 1, i.e., the on-off valves 11 and 12 are closed while the on-off valves 13 and 36 are opened. Consequently, the pressurized gas discharges the liquid raw material replenishment 8 remaining in the pipe 6 into the raw material tank 1 via the flow regulator 15 so as to empty the pipe 6 of the liquid raw material replenishment 8.

In the known liquid replenishing apparatus of FIGS. 1 and 2, a flow velocity of the pressurized gas for delivering the liquid raw material replenishment 8 to the raw material tank 1 is set at a fixed value by the flow regulator 15. As the liquid raw material replenishment 8 remaining in the replenishment tank 7 gradually reduces in amount, a volume of the space 9 in the replenishment tank 7 increases. In the case where the liquid raw material replenishment 8 is supplied to the raw material tank 1 in this state, the on-off valves 11 and 12 are opened and the pressurized gas is introduced into the space 9 via the pipe 10. However, since the flow regulator 15 is provided in the course of the pipe 10, the pressurized gas is introduced into the space 9 at a predetermined flow rate. Thus, as the volume of the space 9 becomes larger, a time period required for raising the pressure in the space 9 to a predetermined pressure increases. For example, supposing that the liquid raw material replenishment 8 is silicon tetrachloride having a specific gravity of 1.48 and the replenishment tank 7 has a capacity of 500 kg, a maximum volume Vmax of the space 9 is given by:

$$Vmax = 500/1.48 = 338 \text{ liters}$$

Let the flow rate of the liquid raw material replenishment 8 set by the flow regulator 15 be 10 liters/min., a time period required for raising the pressure in the space 9 to 1.5 kg/cm³ is:

$$338 \times 1.5/10 = 50.7 \text{ min.}$$

Consequently, the prior art liquid replenishing apparatus has such a disadvantage that as the liquid raw material replenishment 8 remaining in the replenishment tank 7 decreases in amount, a starting point of time for starting supply of the liquid raw material replenishment 8 to the raw material tank 1 is delayed.

Furthermore, in the case where the known liquid replenishing apparatus of FIGS. 1 and 2 is used for supplying the liquid raw material replenishment 8 to a plurality of the raw material tanks 1, the known liquid replenishing apparatus of FIGS. 1 and 2 becomes complicated in structure and needs sophisticated operations by using a control device, etc. Namely, FIG. 3 shows an arrangement of the known liquid replenishing apparatus of FIGS. 1 and 2 in the case of supply of the liquid raw material replenishment 8 to a plurality of n raw material tanks 1(1), 1(2), ..., 1(n), with the character n representing a natural number not less than 2. Supposing that a character i represents an arbitrary natural number from 1 to n, a raw material tank 1(i) is connected with the pipe 6 via an on-off valve 14(i) and an flow regulator 43(i) and is connected with a pipe 5(i). The prior art liquid replenishing apparatus of FIG. 3 further includes a variable flow control device 40, a pressure gauge 41, a control device 42 and an on-off valve 44. When some of the n raw material tanks 1(1), 1(2), ..., 1(n) store therein insufficient amounts of the liquid raw material 2, some of the n on-off valves 14(1), 14(2), ..., 14(n) corresponding to said some of the n raw material tanks 1(1), 1(2), ..., 1(n) are opened so as to be ready for supply of the liquid raw material replenishment 8 to said some of the n raw material tanks 1(1), 1(2), ..., 1(n). Signals indicative of opening and closing of said some of the n on-off valves 14(1), 14(2), ..., 14(n) are transmitted to the control device 42. In the known liquid replenishing apparatus of FIG. 3, prior to supply to the liquid raw material replenishment 8 from the replenishment tank 7 to said some of the raw material tanks 1(1), 1(2), ..., 1(n), the on-off valves 13 and 36 are closed, while the on-off valves 11, 12 and 44 are opened. Thus, the pressurized gas is introduced into the space 9 at a fixed flow rate through the variable flow control device 40 provided, between the on-off valves 12 and 44, in the pipe 10 so as to raise the pressure in the space 9 to a predetermined value. Consequently, as the volume of the space 9 becomes larger, a time period required for starting supply of the liquid raw material replenishment 8 from the replenishment tank 7 to said some of the raw material tanks 1(1), 1(2), ..., 1(n) increased. An internal pressure of the replenishment tank 7 is monitored by the pressure gauge 41 and a pressure signal outputted from the pressure gauge 41 is applied to the control device 42. When the internal pressure of the replenishment tank 7 has reached a predetermined value, the liquid raw material replenishment 8 is supplied to said some of the raw material tanks 1(1), 1(2), ..., 1(n) via the pipe 6 and the opened ones of the on-off valves 14(1), 14(2), ..., 14(n). A flow rate of the pressurized gas into the space 9 is set by the variable flow control device 40 in accordance with the number of said some of the raw material tanks 1(1), 1(2), ..., 1(n).

Meanwhile, since amounts of the liquid raw material replenishment 8 supplied to the raw material tanks 1(1), 1(2), ..., 1(n) decrease as distances between the replenishment tank 7 and the raw material tanks 1(1), 1(2), ..., 1(n) become larger, the flow regulators 43(1), 43(2), ..., 43(n) provided respectively for the raw material tanks 1(1), 1(2), ..., 1(n) are adjusted such that a substantially identical amount of the liquid raw material replenishment 8 is supplied to the raw material tanks 1(1), 1(2), ..., 1(n) regardless of distances between the replenishment tank 7 and the raw material tanks 1(1), 1(2), ..., 1(n). Thus, upon delivery of the pressurized gas into the space 9, the liquid raw material replenishment 8 is supplied to said some of the raw material tanks 1(1), 1(2), ..., 1(n). Subsequently, the on-off valves 11 and 12 are closed, while the on-off valve 13 is opened. Thus, the pressurized gas is carried into the pipe 6 at the flow rate set by the variable flow control device 40 so as to discharge the liquid raw material replenishment 8 remaining in the pipe 6 into said some of the raw material tanks 1(1), 1(2), ..., 1(n), so that the pipe 6 is emptied of the liquid raw material replenishment 8.

Therefore, the prior art liquid replenishing apparatus of FIG. 3 is disadvantageous in that a long time period is required for raising the pressure of the space 9 prior to start of supply of the liquid raw material replenishment 8 to the raw material tanks 1(1), 1(2), ..., 1(n) as described above and its operations are extremely complicated.

Furthermore, the prior art liquid replenishing apparatus of FIG. 3 has such an inconvenience that the variable flow control device 40, the pressure gauge 41, the control device 42, etc. are required to be provided additionally, thereby resulting in rise of its production cost.

SUMMARY OF THE INVENTION

Accordingly, an essential object of the present invention is to provide an improved liquid replenishing apparatus in which a time period required for raising an internal pressure of a replenishment tank to a predetermined value enabling supply of liquid raw material replenishment to a raw material tank undergoes a minimum change regardless of an amount of the liquid raw material replenishment remaining in the replenishment tank, with substantial elimination of the disadvantages inherent in conventional liquid replenishing apparatuses of this kind.

Another important object of the present invention is to provide an improved liquid replenishing apparatus of the above described type for supplying the liquid raw material replenishment to a plurality of the raw material tanks simultaneously, which does not require complicated control devices and can be operated with much ease.

In accomplishing these objects according to one preferred embodiment of the present invention, there is provided an improved liquid replenishing apparatus for supplying liquid raw material replenishment for liquid raw material of an article to at least one raw material tank such that said raw material tank stores therein said liquid raw material, said liquid replenishing apparatus comprising: a replenishment tank for storing therein said liquid raw material replenishment, in which a space is defined above a liquid level of said liquid raw material replenishment; a first pipe which is extended between said replenishment tank and said raw material tank; a second pipe for introducing pressurized gas into said space so as to deliver said liquid raw material replenishment from said replenishment tank to said raw material tank through said first pipe; a branch pipe which gives communication between said first pipe and said second pipe; a pressure regulator which is provided in the course of said second pipe; and a first flow regulator which is provided in the course of said branch pipe.

BRIEF DESCRIPTION OF THE DRAWINGS

These objects and features of the present invention will become apparent from the following description taken in conjunction with the preferred embodiment thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
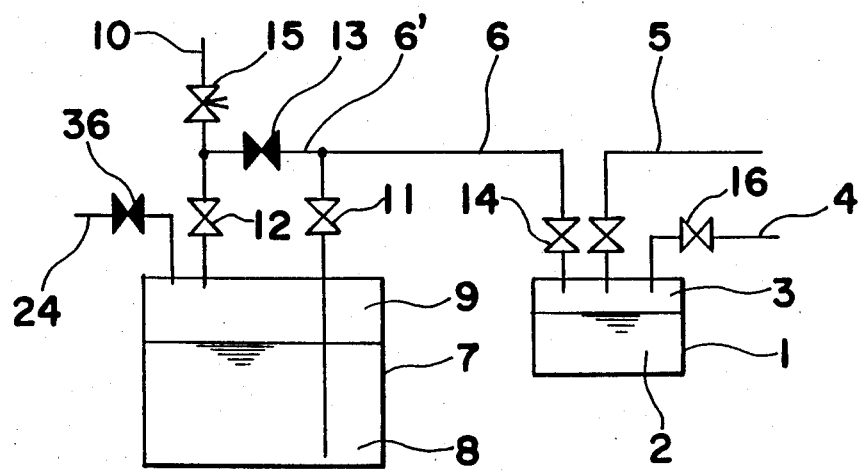
FIG. 1 is a schematic view of a prior art liquid replenishing apparatus (already referred to)
Figure 2:
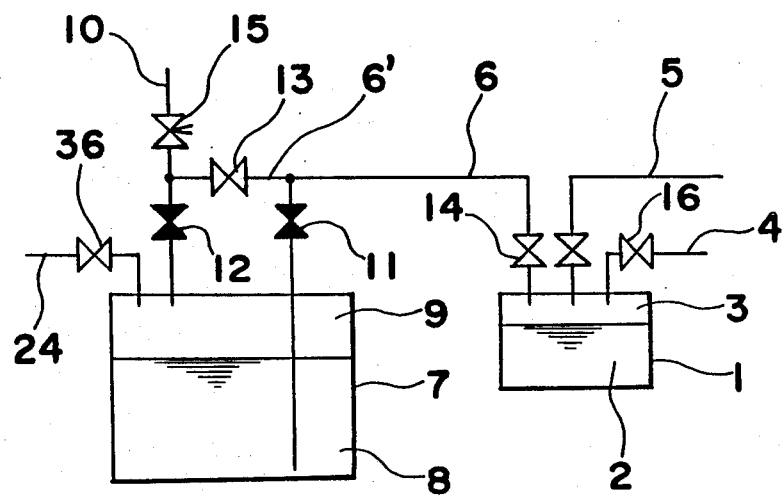
FIG. 2 is a view similar to FIG. 1, particularly showing changeover of on-off valves employed therein (already referred to)
Figure 4:
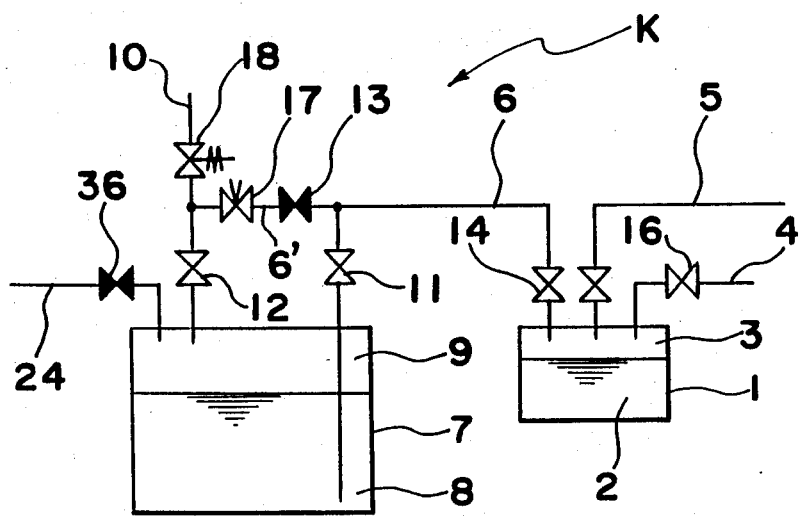
FIG. 4 is a schematic view of a liquid replenishing apparatus according to the present invention.
Figure 5:
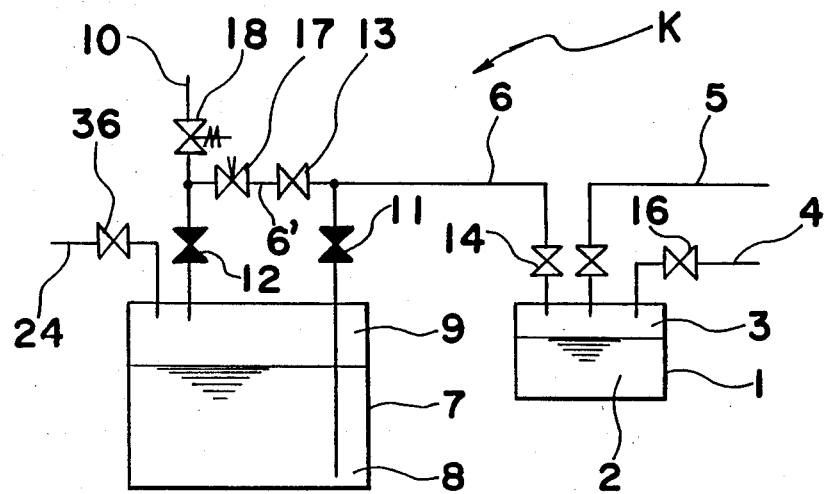
FIG. 5 is a view similar to FIG. 4, particularly showing changeover of on-off valves employed therein.

Referring now to the drawings, there is shown in FIGS. 4 and 5, a liquid replenishing apparatus K according to one preferred embodiment of the present invention. As shown in FIGS. 4 and 5, the liquid replenishing apparatus K includes a raw material tank 1 for storing therein liquid raw material 2 of optical fiber, pipes 4 to 6, 10 and 24, a branch pipe 6', a replenishment tank 7 for storing therein liquid raw material replenishment 8 for the liquid raw material 2, and on-off valves 11 to 14, 16 and 36 in the same manner as the prior art liquid replenishing apparatus of FIGS. 1 and 2. Since functions of these components have been earlier described with reference to FIGS. 1 and 2, description thereof is abbreviated for the sake of brevity. Meanwhile, a space 3 is defined above a liquid level of the liquid raw material 2 in the raw material tank 1, while a space 9 is defined above a liquid level of the liquid raw material replenishment 8 in the replenishment tank 7.

The liquid replenishing apparatus K further includes a pressure regulator 18 provided in the course of the pipe 10 and a flow regulator 17 provided in the course of the branch pipe 6'. In FIG. 4, saturated vapor of the liquid raw material 2 is delivered, through the pipe 5, from the raw material tank 1 to a reaction burner (not shown) for continuously producing a base material of glass for optical fiber. Accordingly, the liquid raw material replenishment 8 should be supplied from the replenishment tank 7 to the raw material tank 1 prior to depletion of the liquid raw material 2 in the raw material tank 1.

In order to supply the liquid raw material replenishment 8 from the replenishment tank 7 to the raw material tank 1, the on-off valves 13 and 36 are closed while the on-off valves 11 and 12 are opened as shown in FIG. 4 such that pressurized gas is drawn into the space 9 via the pressure regulator 18 provided in the course of the pipe 10. At this time, the pressurized gas is rapidly carried into the space 9 until the pressurized gas reaches a desired pressure set by the pressure regulator 18. When the space 9 has reached a predetermined pressure, the liquid raw material replenishment 8 in the replenishment tank 7 is delivered to the raw material tank 1 through the pipe 6 by the predetermined pressure of the space 9. When the liquid raw material replenishment 8 has been fed into the raw material tank 1 up to a desired amount of the liquid raw material 2 therein, the on-off valves 11 and 12 are closed so as to stop supply of the liquid raw material replenishment 8 to the raw material tank 1 and the on-off valves 13 and 36 are opened as shown in FIG. 5. Namely, since the liquid raw material replenishment 8 still remains in the pipe 6, the liquid raw material replenishment 8 remaining in the pipe 6 is required to be completely discharged into the raw material tank 1 by introducing the pressurized gas into the pipe 6 upon opening of the on-off valve 13. At this time, the flow regulator 17 provided in the course of the branch pipe 6' prevents an excessive amount of the pressurized gas from flowing into the raw material tank 1 after the liquid raw material replenishment 8 remaining in the pipe 6 has been completely discharged into the raw material tank 1. In the case where the flow regulator 17 is not provided in the course of the branch pipe 6', such a phenomenon undesirably takes place that a large amount of the pressurized gas suddenly flows into the raw material tank 1 after the liquid raw material replenishment 8 remaining in the pipe 6 has been completely discharged into the raw material tank 1, thereby adversely affecting reliability of a pressure resistant structure of the liquid replenishing apparatus K and efficiency of treatment of exhaust gas generated in the raw material tank 1.

Thus, the liquid replenishing apparatus K includes the pressure regulator 18 provided in the pipe 10 for introducing the pressurized gas into the replenishment tank 7 and the flow regulator 17 provided in the branch pipe 6' communicating with the pipes 10 and 6 and is operated through changeover of the on-off valve 12 of the pipe 10, the on-off valve 11 of the pipe 6 and the on-off valve 13 of the branch pipe 6'. By using the liquid replenishing apparatus K, it is possible to easily and safely supply the liquid raw material replenishment 8 from the replenishment tank 7 to the raw material tank 1.

Figure 3:
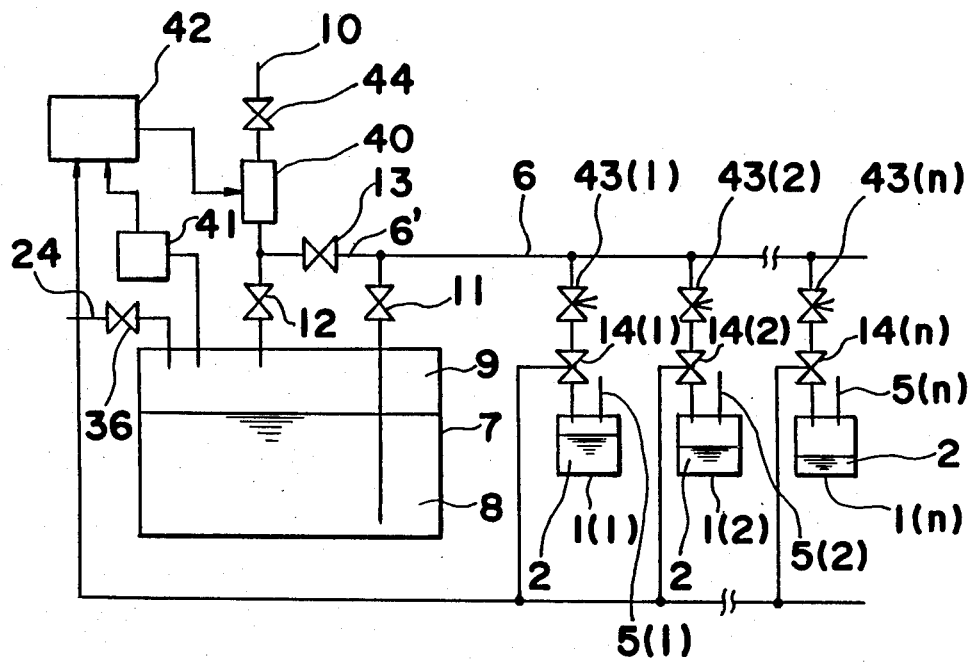
FIG. 3 is a schematic view of a prior art liquid replenishing apparatus for supplying liquid raw material replenishment to a plurality of raw material tanks (already referred to)
Figure 6:
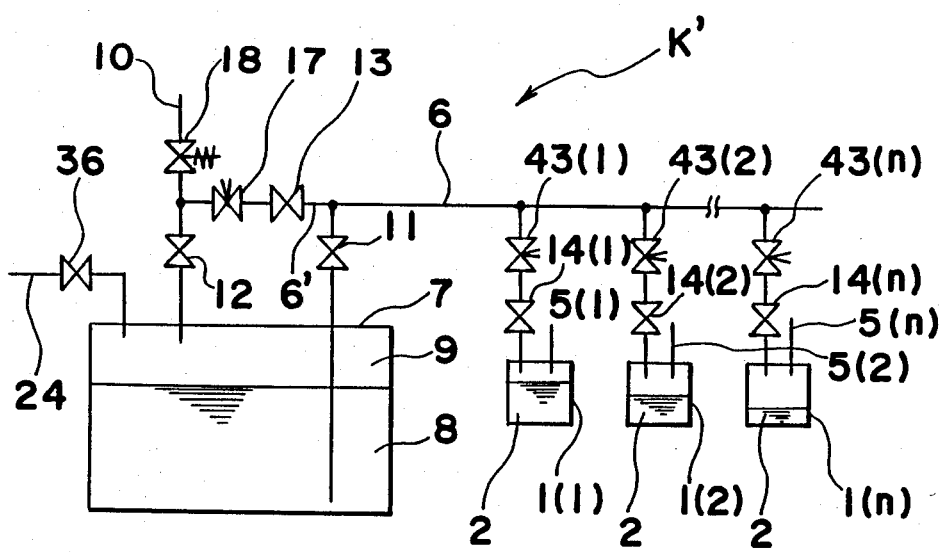
FIG. 6 is a view similar to FIG. 4, particularly showing a modification thereof for supplying liquid raw material replenishment to a plurality of raw material tanks.

Then, referring further to FIG. 6, there is shown a liquid replenishing apparatus K' which is a modification of the liquid replenishing apparatus K and is used for supplying the liquid raw material replenishment 8 to a plurality of n raw material tanks 1(1), 1(2), . . . , 1(n), with the character n representing a natural number not less than 2. Provided that a character i represents an arbitrary natural number from 1 to n, a raw material tank 1(i) is connected with the pipe 6 via an on-off valve 14(i) and a flow regulator 43(i) and is connected with a pipe 5(i) in the same manner as in the prior art liquid replenishing apparatus of FIG. 3. Since other constructions of the liquid replenishing apparatus K' are the same as those of the liquid replenishing apparatus K, the liquid replenishing apparatus K' has been remarkably simplified in structure as compared with the prior art liquid replenishing apparatus of FIG. 3. When some of the n raw material tanks 1(1), 1(2), . . . , 1(n) stores therein insufficient amounts of the liquid raw material 2 and the liquid raw material replenishment 8 is supplied to said some of the n raw material tanks 1(1), 1(2), . . . , 1(n), the on-off valves 11 and 12 are opened, while the on-off valves 13 and 36 are closed. Thus, the pressurized gas is rapidly drawn into the space 9 of the replenishment tank 7 by the pressure regulator 18 until the space 9 reaches a predetermined pressure. While the internal pressure of the replenishment tank 7 is being maintained at a predetermined value, the liquid raw material replenishment 8 is supplied to said some of the n raw material tanks 1(1), 1(2), . . . , 1(n) through corresponding opened ones of the n on-off valves 14(1), 14(2), . . . , 14(n). Since the n raw material tanks 1(1), 1(2), . . . , 1(n) are, respectively, provided with the n flow regulators 43(1), 43(2), . . . , 43(n) and the n on-off valves 14(1), 14(2), . . . , 14(n), the flow rate of the liquid raw material replenishment 8 is so controlled by the flow regulators 43(1), 43(2), . . . , 43(n) such that a substantially identical amount of the liquid raw material replenishment 8 is supplied to the raw material tanks 1(1), 1(2), . . . , 1(n) regardless of distances between the replenishment tank 7 and the raw material tanks 1(1), 1(2), . . . , 1(n). Thereafter, when supply of the liquid raw material replenishment 8 from the replenishment tank 7 to said some of the raw material tanks 1(1), 1(2), . . . , 1(n) by the use of the pressurized gas has been stopped, the on-off valves 11 and 12 are closed and the on-off valve 13 is opened. Thus, the pressurized gas in the pipe 10 is admitted into the pipe 6 so as to completely discharge the liquid raw material replenishment 8 remaining in the pipe 6 into said some of the raw material tanks 1(1), 1(2), . . . , 1(n) such that the pipe 6 is emptied of the liquid raw material replenishment 8.

At this time, since the flow rate of the pressurized gas from the pipe 10 is set at a fixed value by the flow regulator 17 provided in the branch pipe 6', such a phenomenon does not take place that a large amount of the pressurized gas suddenly flows into said some of the raw material tanks 1(1), 1(2), . . . , 1(n) after the liquid raw material replenishment 8 remaining in the pipe 6 has been discharged into said some of the raw material tanks 1(1), 1(2), . . . , 1(n).

As is clear from the foregoing description, even in the case where the liquid raw material replenishment is supplied to a plurality of the raw material tanks by the liquid replenishing apparatus of the present invention, pressure of the space 9 of the replenishment tank is rapidly raised so as to enable start of supply of the liquid raw material replenishment in a short period of time. Furthermore, in the liquid replenishing apparatus of the present invention, such a phenomenon does not take place that an excessive amount of the pressurized gas flows into the raw material tanks after the liquid raw material replenishment remaining in the pipe 6 has been discharged into the raw material tanks. Moreover, the liquid replenishing apparatus of the present invention has been simplified in structure without the need for provision of the variable flow control device, the control device, etc. of the known liquid replenishing apparatuses and can be operated with much ease.

Accordingly, in accordance with the present invention, since the pressure regulator 18 is provided in the course of the pipe 10 for delivering the pressurized gas into the replenishment tank, the pressurized gas is rapidly introduced into the space 9 of the replenishment tank regardless of volume of the space 9 so as to supply the liquid raw material replenishment from the replenishment tank to the raw material tank such that supply of the liquid raw material replenishment from the replenishment tank to the raw material tank can be started in a short period of time regardless of the amount of of the liquid raw material replenishment remaining in the replenishment tank.

Furthermore, in accordance with the present invention, since the flow regulator 17 is provided in the course of the branch pipe 6' communicating with the pipes 10 and 6, an excessive amount of the pressurized gas is prevented from flowing into the raw material tank after the liquid raw material replenishment remaining in the pipe 6 has been discharged into the raw material tank, thereby ensuring safety of the liquid replenishing apparatus of the present invention.

Meanwhile, in accordance with the present invention, even in the case where the liquid raw material replenishment is supplied to a plurality of the raw material tanks or the number of the raw material tanks subjected to supply of the liquid raw material replenishment changes, the liquid replenishing apparatus is not required to be additionally provided with complicated devices such as the variable flow control device, the control device, the pressure gauge, etc. and can be operated with much ease, thus economically advantageously reducing its production cost.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A liquid replenishing apparatus for supplying liquid raw material replenishment for liquid raw material of an article to at least one raw material tank such that said raw material tank stores therein said liquid raw material, said liquid replenishing apparatus comprising:
    a replenishment tank for storing therein said liquid raw material replenishment, in which a space is defined above a liquid level of said liquid raw material replenishment;
    a first pipe extending between said replenishment tank and said raw material tank;
    a second pipe for introducing pressurized gas into said space so as to deliver said liquid raw material replenishment from said replenishment tank to said raw material tank through said first pipe;
    a branch pipe communicating between said first pipe and said second pipe;
    a pressure regulator which is provided in the course of said second pipe and which regulates the supply of said pressurized gas to said space so as to initiate without delay supply of liquid raw material replenishment from said replenishment tank to said raw material tank regardless of the amount of said liquid raw material replenishment remaining in said replenishment tank; and
    a first flow regulator which is provided in the course of said branch pipe, said first flow regulator being designed so as to permit discharge of said liquid raw material replenishment remaining in said first pipe into said raw material tank after supply of said liquid raw material replenishment to said raw material tank.

2. A liquid replenishing apparatus as claimed in claim 1, which supplies said liquid raw material replenishment to a plurality of said raw material tanks and further comprises:
    a plurality of second flow regulators which are provided in the course of said first pipe such that said first pipe extends into said raw material tanks through said second flow regulators, respectively.

3. A liquid replenishing apparatus as claimed in claim 1, wherein said article is optical fiber.

4. A liquid replenishing apparatus as claimed in claim 2, wherein said article is optical fiber.

* * * * *